(12) United States Patent
Isoda

(10) Patent No.: US 7,042,021 B2
(45) Date of Patent: May 9, 2006

(54) LIGHT EMITTING DIODE WITH REFLECTION CUP

(75) Inventor: Hiroto Isoda, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 16 days.

(21) Appl. No.: 10/953,576

(22) Filed: Sep. 30, 2004

(65) Prior Publication Data

US 2005/0263786 A1 Dec. 1, 2005

(30) Foreign Application Priority Data

Oct. 2, 2003 (JP) ............................ 2003-344096

(51) Int. Cl.
*H01L 33/00* (2006.01)
(52) U.S. Cl. ........................... 257/98; 257/99; 257/100
(58) Field of Classification Search ........... 257/98–100
See application file for complete search history.

(56) References Cited

U.S. PATENT DOCUMENTS

| | | | | |
|---|---|---|---|---|
| 3,821,775 A | * | 6/1974 | Baird | ........................... 257/98 |
| 5,534,718 A | * | 7/1996 | Chang | ........................... 257/98 |
| 6,274,890 B1 | * | 8/2001 | Oshio et al. | ................... 257/98 |
| 6,495,861 B1 | * | 12/2002 | Ishinaga | ....................... 257/99 |
| 6,774,406 B1 | * | 8/2004 | Isoda | ........................... 257/99 |

FOREIGN PATENT DOCUMENTS

JP 2002-324917 11/2002

* cited by examiner

*Primary Examiner*—Gene M. Munson
(74) *Attorney, Agent, or Firm*—Browdy and Neimark, PLLC

(57) ABSTRACT

A light emitting diode of this invention comprises: a base substrate having a pair of electrode portions; a light emitting element mounted on the base substrate and electrically connected to the electrode portions; a reflection cup placed on the base substrate to surround the light emitting element; and a resin sealant sealing the light emitting element; wherein the base substrate is formed with a raised portion on an upper surface thereof and the light emitting element is placed on a top surface of the raised portion so that side surfaces of the light emitting element are situated higher than a lower end of the reflection cup. With this construction, light emitted from the side surfaces of the light emitting element can be extracted efficiently in an upward direction.

4 Claims, 6 Drawing Sheets

LIGHT EMITTING DIODE WITH REFLECTION CUP

CROSS REFERENCE TO RELATED APPLICATION

The application claims the priority benefit of Japanese Patent Application No. 2003-344096, filed on Oct. 2, 2003, the entire description of which is incorporated herein by reference.

BACKGROUND OF THE INVENTION

1. Field of the Invention

The present invention relates to a light emitting diode used for illuminating a variety of electronic devices and also in recent years for illuminating panel meters of automobiles, and in particular, relates to a light emitting diode provided with a reflection cup to give an illuminating light a desired directivity.

2. Description of Related Art

An example of light emitting diode of this kind is disclosed in Japanese Patent Disclosure No. 2002-324917. This light emitting diode, as shown in FIG. 1, comprises a base substrate 2 surface-mounted on a mother board 1, a light emitting element 3 put on an upper surface of the base substrate 2, a reflection cup 4 arranged to surround the light emitting element 3, a resin sealant 5 sealing the light emitting element 3 and the reflection cup 4, and a dome-shaped light collecting member 6 placed on the resin sealant 5.

In such a light emitting diode, light emitted from the light emitting element 3 is reflected by an inner circumferential surface of the reflection cup 4 to be given an upward directivity and then passes through a lens portion 6a of the light collecting member 6 to have a stronger directivity.

In recent years, there is a growing demand for a light emitting diode with a so-called narrow directivity, which focuses light emitted from a light emitting element and illuminates the focused light on a point. To realize such a narrow directivity, it is desired, as shown in FIG. 2, that an inner circumferential surface 7 of the reflection cup 4a be formed in a paraboloidal shape, with the light emitting element 3a disposed at a focus of the paraboloid. With this arrangement the light emitted from the light emitting element 3a can be collimated into upward parallel rays when reflected by the inner circumferential surface 7 of the reflection cup 4a. Thus, an inner circumferential edge 9 at the lower end of the reflection cup 4a near the light emitting element 3a is preferably formed into a sharp inclined shape 10 that smoothly merges with the paraboloidal surface of the inner circumferential surface 7.

However, when the reflection cup 4a is formed by a plastic material, the sharp inclined shape 10 is difficult to form along the inner circumferential edge 9 of the cup and in practice the end of the inner circumferential edge 9 is deformed or rounded. Especially when the light emitting element 3a is flip-chip mounted, since a lower end 12 of a light emitting face 11 of the light emitting element 3a is very close to an upper surface of the base substrate 2, only about a few tens of μm apart, the shape of the inner circumferential edge 9 has a significant effect on the reflection of light. When the light emitted from the light emitting face 11 of the light emitting element 3a strikes the inner circumferential edge 9 at the lower end of the reflection cup 4a, the light is scattered, rendering the control of narrow light directivity difficult. The above problem is also experienced when the reflection cup 4a is formed by press-forming a metal material.

SUMMARY OF THE INVENTION

An object of the present invention is to provide a light emitting diode so constructed that light emitted from side surfaces of a light emitting element does not strike a lower end of a reflection cup, thereby preventing the light from being scattered, ensuring that the emitted light can be extracted upward efficiently and making it possible to control the emission of light with a narrow directivity.

To achieve the above objective, the light emitting diode of this invention comprises: a base substrate having a pair of electrodes disposed thereon; a light emitting element mounted on the base substrate and electrically connected to the pair of the electrodes; a reflection cup placed on the base substrate to surround the light emitting element; and a resin sealant sealing the light emitting element; wherein the base substrate is formed with a raised portion on an upper surface thereof and the light emitting element is placed on a top surface of the raised portion so that side surfaces of the light emitting element are situated higher than a lower end of the reflection cup.

As one example of this invention, the base substrate may use a flexible substrate. The raised portion is formed by press-forming the flexible substrate.

As another example of this invention, the reflection cup has been formed at a lower end thereof an opening larger in two-dimensional size than the raised portion, with a circumferential edge of the opening placed around an outer periphery of the raised portion.

As still another example of this invention, a hole is formed at a position of the raised portion of the base substrate directly below the light emitting element placed, and the hole passes completely through to the other side of the base substrate. At the other side of the base substrate, a reflecting film is provided to cover the hole and to reflect light emitted from an underside of the light emitting element.

With this invention, since the light emitted from the side surfaces of the light emitting element does not strike the lower end of the reflection cup, light scattering can be prevented. Thus upward parallel rays of light can be extracted more efficiently. The light emitting diode therefore has a desired narrow directivity.

DETAILED DESCRIPTION OF THE PREFERRED EMBODIMENT

Figure 1:
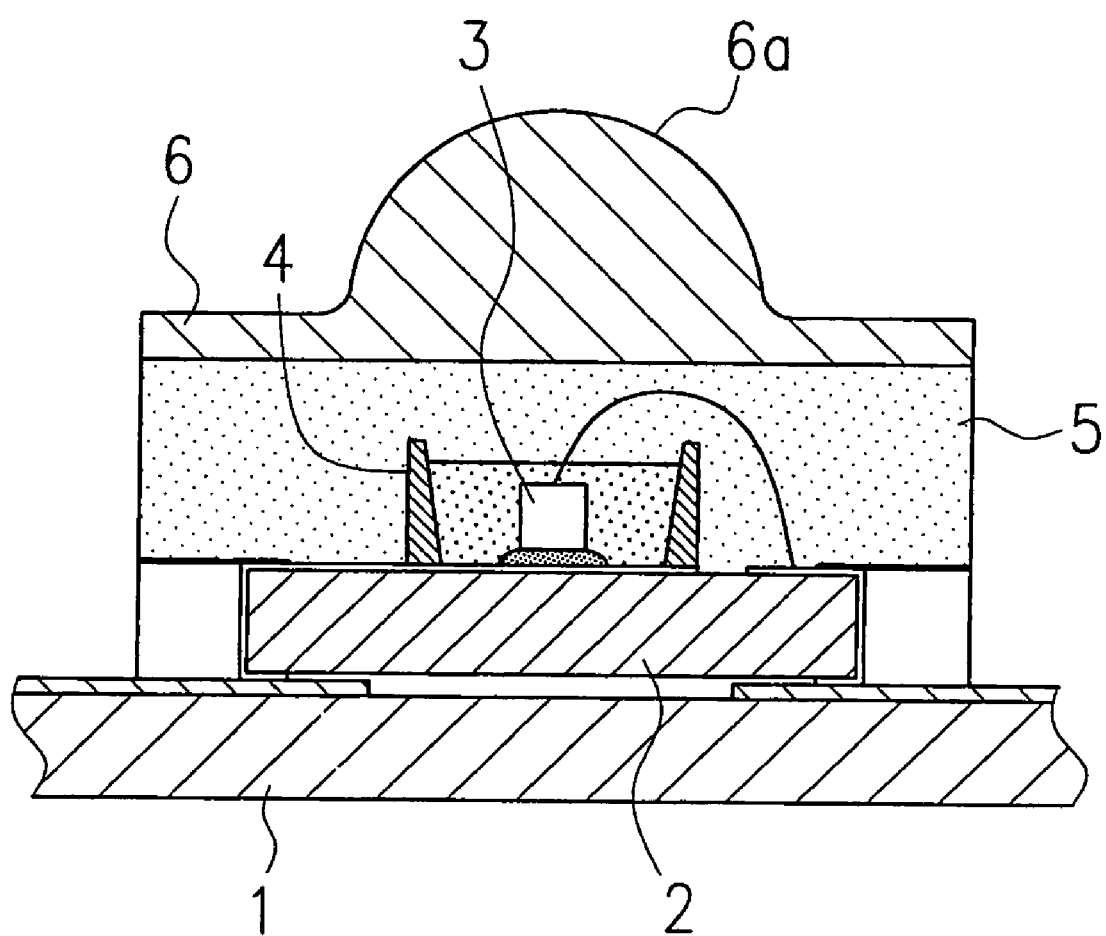
FIG. 1 is a cross-sectional view of one example of a conventional light emitting diode.
Figure 2:
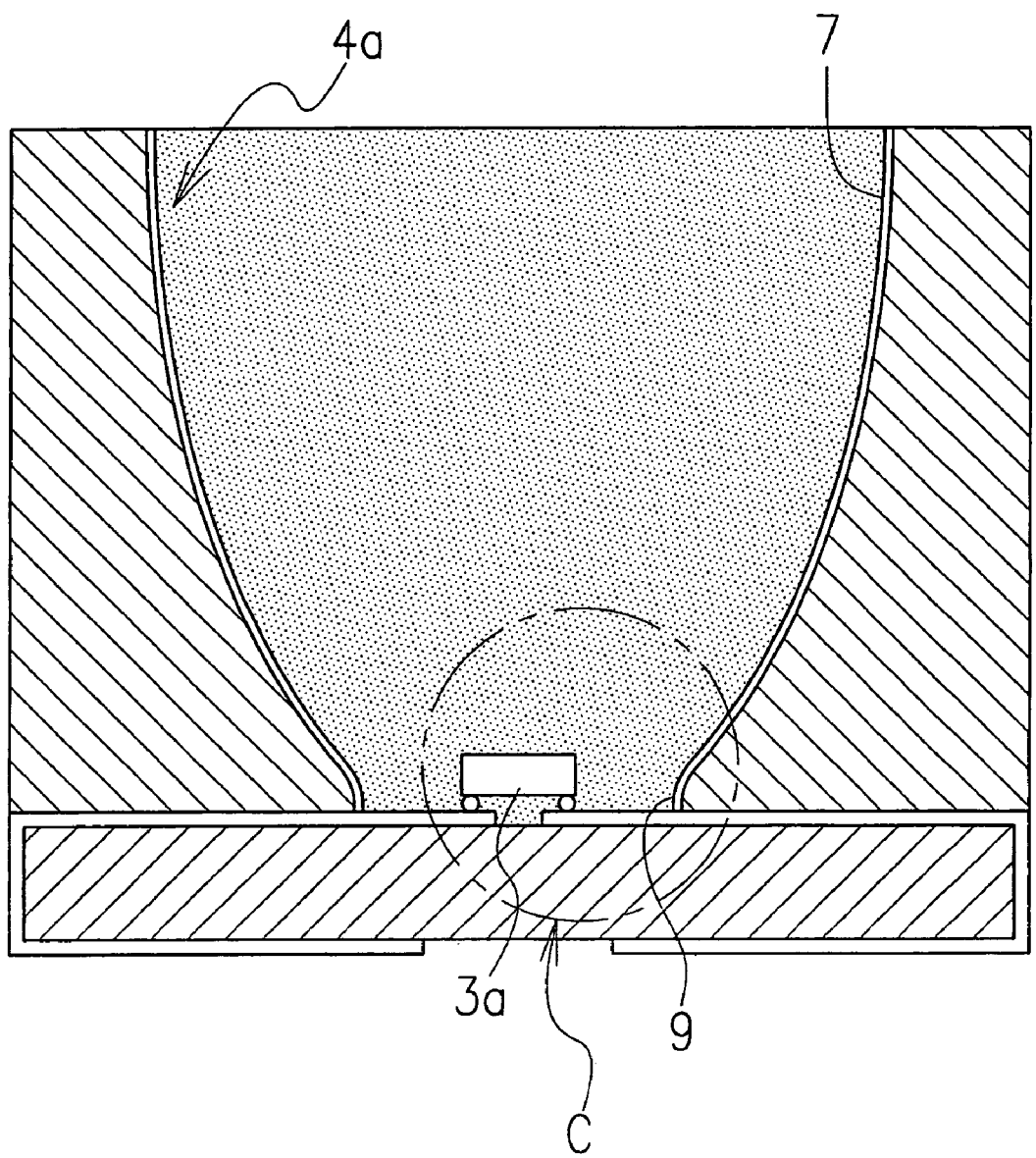
FIG. 2 is a cross-sectional view of another example of a conventional light emitting diode.
Figure 3:
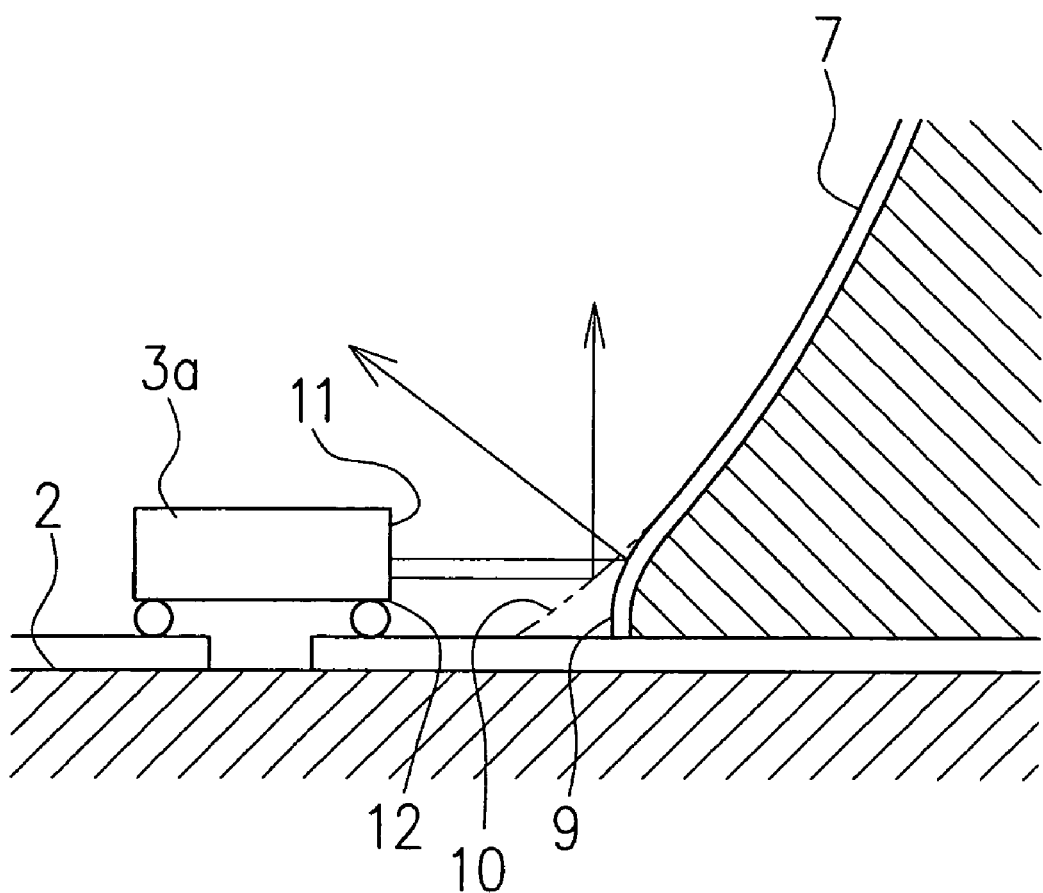
FIG. 3 is an enlarged view of a part C of the light emitting diode of FIG. 2.
Figure 4:
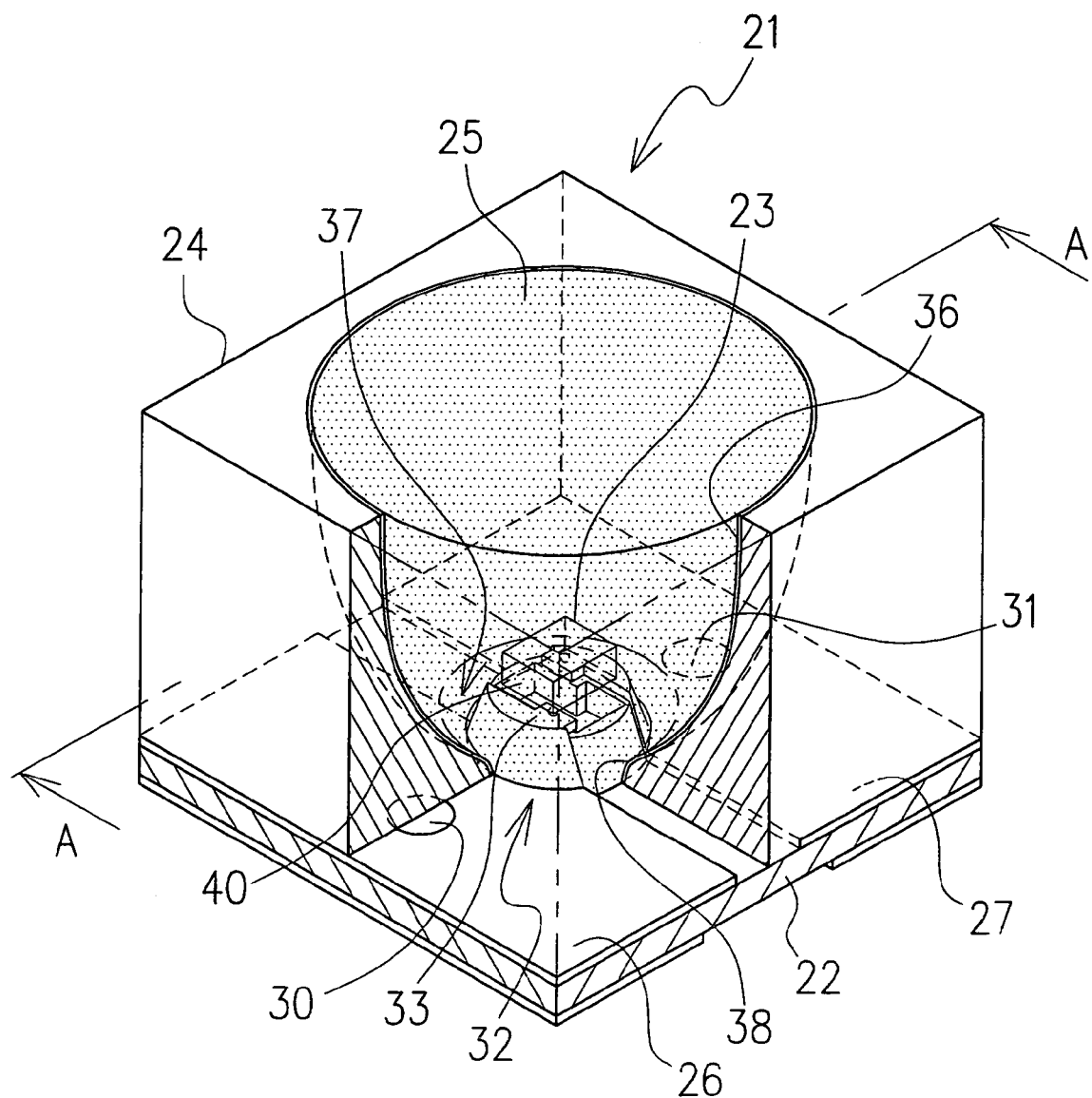
FIG. 4 is a perspective view showing one embodiment of a light emitting diode according to this invention.
Figure 5:
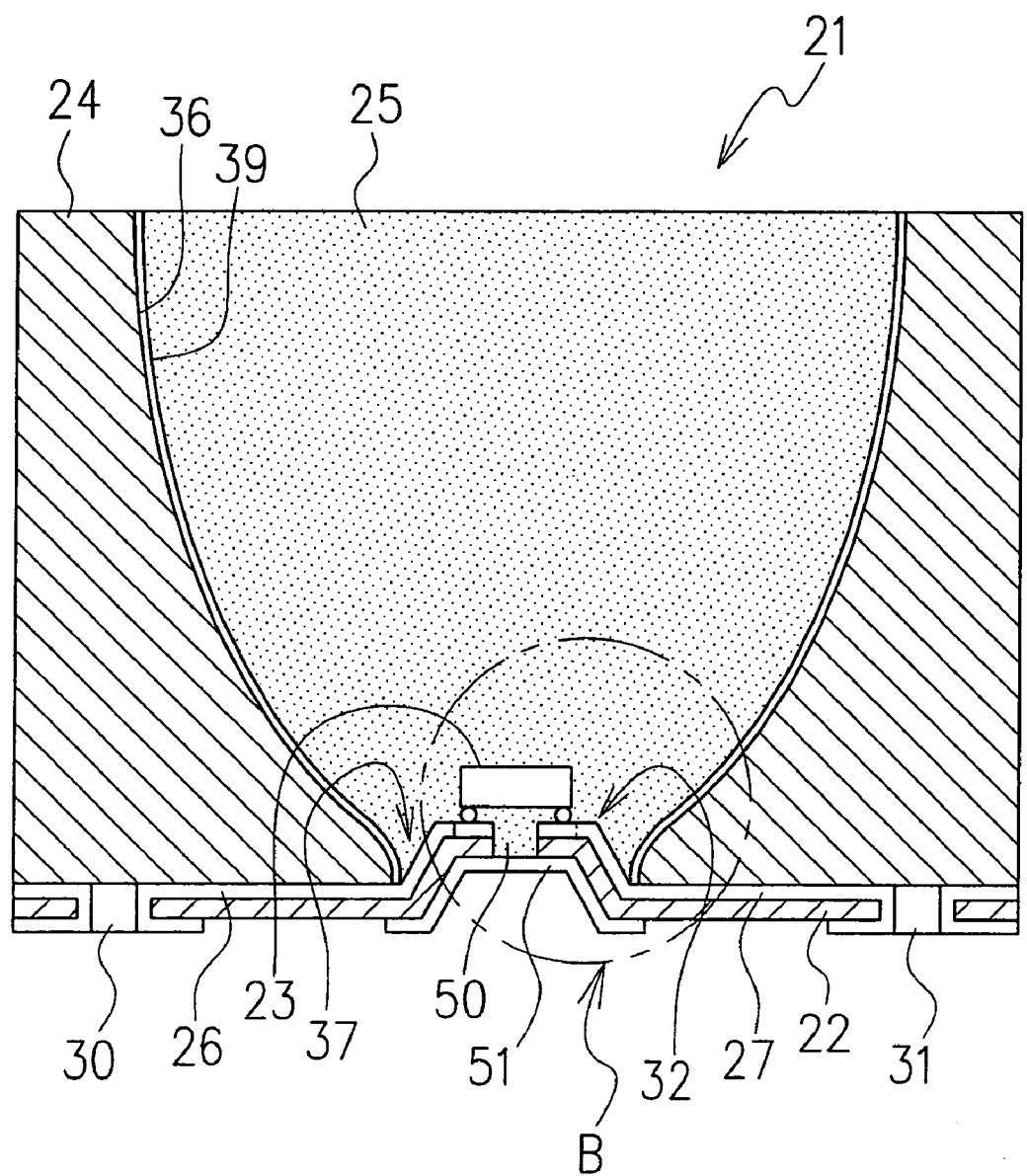
FIG. 5 is a cross-sectional view of the light emitting diode of FIG. 4 taken along the line A—A.
Figure 6:
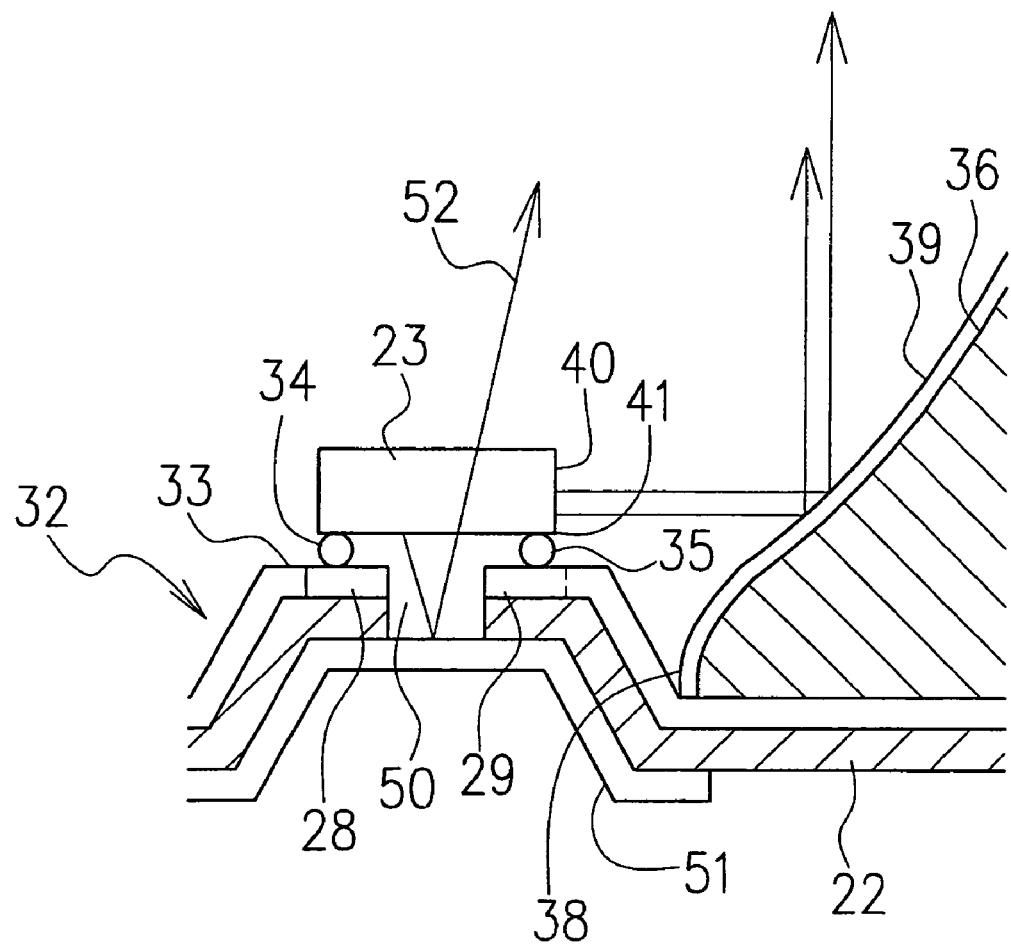
FIG. 6 is an enlarged view of a part B of the light emitting diode of FIG. 5.

Now, one embodiment of the light emitting diode according to the present invention will be described in detail by referring to the accompanying drawings. FIG. 4 is a perspective view showing an overall construction of the light emitting diode as one embodiment of the invention. FIG. 5 is a cross-sectional view taken along the line A—A of FIG. 4. FIG. 6 is an enlarged view of a part B in FIG. 5.

As shown in FIG. 4 to FIG. 6, a light emitting diode 21 of this invention comprises, for example, an almost square base substrate 22 having a predetermined electrode pattern formed on a surface of a flexible substrate, a light emitting element 23 disposed at an almost central part of an upper surface of the base substrate 22, a reflection cup 24 arranged to surround the light emitting element 23 to control a directivity of light emitted from the light emitting element 23, and a light transmitting resin sealant 25 filled in the reflection cup 24.

The electrode pattern formed on the base substrate 22 has a cathode 26 and an anode 27 separated from each other at nearly the central part of the base substrate 22. At the central part of the base substrate 22 where the cathode 26 and the anode 27 face each other, these electrodes are formed with protrusions 28, 29 on which the light emitting element 23 is mounted. The cathode 26 and the anode 27 extend through via through-holes 30, 31 to the back side of the base substrate 22 for electric connection to the mother board (not shown).

What deserves attention in this embodiment is that a frustoconical raised portion 32 is formed at an almost central part of the base substrate 22 and the light emitting element 23 is mounted on a top surface 33 of the raised portion 32. The cathode 26 and the anode 27 are formed to extend along the surface of the raised portion 32, with the protrusions 28, 29 situated at a central part of the raised portion 32. The raised portion 32 is formed integral with the base substrate 22 by holding a flexible substrate between heated male and female molds and press-forming it. The top surface 33 of the raised portion 32 is formed with a hook-shaped hole 50 vertically piercing through the base substrate 22. The interior of the hole 50 is also filled with the light transmitting resin sealant 25.

The base substrate 22 is provided with a reflection film 51 on its back at a position facing the hole 50 so that the hole 50 is covered with the reflection film 51. The reflection film 51 provides a reflection surface to reflect light emitted from the underside of the light emitting element 23. Thus, the light emitted from the underside of the light emitting element 23, when it enters into the hole 50, is reflected by the reflection film 51 provided under the hole 50 and then travels back through the hole 50 as upward reflected rays 52.

The light emitting element 23 mounted on the top surface 33 of the raised portion 32 is available in a variety of illuminating colors and a desired color can be chosen according to the use. The light emitting element 23 is electrically connected to the cathode 26 and the anode 27 through a pair of solder bumps 34, 35 provided on the underside of the light emitting element 23. More specifically, the light emitting element 23 is put on the top surface 33 of the raised portion 32, with its paired bumps 34, 35 such as solder bumps, gold bumps, and so on secured to the protrusions 28, 29 of the cathode 26 and the anode 27. The use of the bumps 34, 35 can reduce the size of the light emitting diode 21 and is therefore advantageous in producing light with a narrow directivity. It is of course possible to use bonding wires for electric connection instead of the bumps 34, 35.

In this embodiment, the reflection cup 24 arranged to surround the light emitting element 23 is formed of a resin-molded block almost equal in size to an external dimension of the base substrate 22. The resin-molded block is formed with a large recess 36 at a central part of the upper surface thereof. At a lower end of the recess 36 is formed a circular hole 37, which is larger in two-dimensional size than the raised portion 32 so that, when the reflection cup 24 is mounted on the base substrate 22, the light emitting element 23 and the raised portion 32 are exposed through the circular hole 37 to the interior of the cup 24. Especially in this embodiment, a circumferential edge 38 of the circular hole 37 surrounds the raised portion 32 in such a manner that it contacts an outer periphery of the raised portion 32.

The recess 36 of the reflection cup 24 has the shape of a parabola in cross section, as shown in FIG. 4 and FIG. 5. Thus, with the circumferential edge 38 of the circular hole 37 surrounding and contacting the outer periphery of the raised portion 32, the light emitting element 23 on the top surface 33 of the raised portion 32 can be located almost at the focus of the paraboloid of the reflection cup 24. When this arrangement is employed, the light emitted from the light emitting element 23 does not strike the circumferential edge 38 of the circular hole 37 but is reflected by the inner circumferential surface of the reflection cup 24 above the circumferential edge 38. This allows the light emitted from the diode to be extracted as upward parallel rays.

In this embodiment the reflection cup 24 is formed of a plastic material and therefore the circumferential edge 38 of the circular hole 37 at the lower end of the recess is somewhat deformed or rounded, as in the case of the conventional construction described earlier. Further, the inner circumferential surface of the recess 36 is deposited with a metal film 39 by evaporation. The metal film 39 should preferably formed of metal materials having a high reflection factor, such as aluminum and silver.

As described above, the reflection cup 24 of the above construction is mounted on the base substrate 22, with the bottom surface of the resin-molded block bonded to the upper surface of the base substrate 22 in such a way that the circumferential edge 38 of the circular hole 37 positioned close to the outer periphery of the raised portion 32 of the base substrate 22. As a result, the light emitting element 23 on the top surface 33 of the raised portion 32 is situated higher than the lower end of the reflection cup 24.

Next, the reflection action of the light emitting diode 21 of the above construction will be explained by referring to FIG. 6. As shown in FIG. 6, the circumferential edge 38 of the circular hole 37 formed at the lower end of the reflection cup 24 is situated below a lower end 41 of a light emitting face 40 of the light emitting element 23. Thus, the light coming out of the light emitting face 40 of the light emitting element 23 does not strike the circumferential edge 38 of the circular hole 37 of the reflection cup 24 but is reflected by the inner circumferential surface of the recess 36 at positions higher than the circumferential edge 38. This prevents the light emitted from the light emitting face 40 from being scattered by the reflection cup 24, enabling the emitted light to be extracted as upward parallel rays efficiently.

As a result, the control of light directivity is facilitated and a light emitting diode with a narrow directivity can be obtained. Especially when the raised portion 32 is formed by press-forming a flexible substrate, as in this embodiment, the need to provide a separate sub-mount substrate on the base substrate 22 is obviated, making the construction of the light emitting diode 21 simple and reducing the manufacturing cost correspondingly.

Although in the above embodiment the reflection cup 24 has been described to be formed of a plastic material, it can also be formed of a metal material by press forming. Further, while in the above embodiment the resin sealant 25 is filled in the entire recess 36 of the reflection cup 24, it is also possible to seal only the light emitting element 23 and the raised portion 32 with a resin and to eliminate the resin sealant 25 filled in the recess 36 of the reflection cup 24.

What is claimed is:

1. A light emitting diode comprising:
    a base substrate having a pair of electrodes;
    a light emitting element mounted on the base substrate and electrically connected to the electrodes;
    a reflection cup placed on the base substrate to surround the light emitting element;
    and a resin sealant sealing the light emitting element;
    wherein the base substrate is formed with a raised portion on an upper surface thereof and the light emitting element is placed on a top surface of the raised portion so that side surfaces of the light emitting element are situated higher than a lower end of the reflection cup.

2. A light emitting diode according to claim 1, wherein the base substrate is formed of a flexible substrate and the raised portion is formed by press-forming the flexible substrate.

3. A light emitting diode according to claim 1, wherein the reflection cup has formed at a lower end thereof an opening larger in two-dimensional size than the raised portion and a circumferential edge of the opening is placed around an outer periphery of the raised portion.

4. A light emitting diode according to claim 1, further comprising a hole formed on the base substrate and a reflecting film wherein the hole is formed at a position of the raised portion of the base substrate directly below the light emitting element placed, and the hole passes completely through to the other side of the base substrate and the reflecting film is provided at the other side of the base substrate to cover the hole and to reflects light emitted from an underside of the light emitting element.

* * * * *